(12) United States Patent
Chen et al.

(10) Patent No.: US 7,875,555 B2
(45) Date of Patent: Jan. 25, 2011

(54) METHOD FOR PLASMA PROCESSING OVER WIDE PRESSURE RANGE

(75) Inventors: Lee Chen, Cedar Creek, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 635 days.

(21) Appl. No.: 11/947,038

(22) Filed: Nov. 29, 2007

(65) Prior Publication Data

US 2009/0142929 A1     Jun. 4, 2009

(51) Int. Cl.
*H01L 21/302* (2006.01)

(52) U.S. Cl. .................. 438/714; 438/710; 156/345.3; 216/67

(58) Field of Classification Search ................. 438/706, 438/710, 712, 714, 720, 717; 156/345.3, 156/51, 39; 216/67, 68
See application file for complete search history.

(56) References Cited

U.S. PATENT DOCUMENTS

| 5,180,435 A | * | 1/1993 | Markunas et al. | ...... 118/723 IR |
| 5,851,600 A | * | 12/1998 | Horiike et al. | .............. 427/535 |
| 6,331,701 B1 | * | 12/2001 | Chen et al. | .................. 250/251 |
| 2006/0065367 A1 | | 3/2006 | Chen et al. | |

* cited by examiner

*Primary Examiner*—Lan Vinh

(57) ABSTRACT

A method for treating a substrate with plasma over a wide pressure range is described. The method comprises exposing the substrate to a low pressure plasma in a process chamber. Further, the method comprises exposing the substrate to a high pressure plasma in the process chamber.

20 Claims, 4 Drawing Sheets

METHOD FOR PLASMA PROCESSING OVER WIDE PRESSURE RANGE

CROSS-REFERENCE TO RELATED APPLICATIONS

This application is related to co-pending U.S. patent application Ser. No. 11/871,865, entitled "Method and system for low pressure plasma processing", filed on Oct. 12, 2007. The entire content of this application is herein incorporated by reference in its entirety.

BACKGROUND OF THE INVENTION

1. Field of the Invention

The invention relates to a method for performing plasma processing on a substrate and, more particularly, to a method for processing a substrate with a low pressure plasma and a high pressure plasma in the same plasma processing system.

2. Description of Related Art

During semiconductor processing, plasma is often utilized to assist etch processes by facilitating the anisotropic removal of material along fine lines or within vias (or contacts) patterned on a semiconductor substrate. Furthermore, plasma is utilized to enhance the deposition of thin films by providing improved mobility of adatoms on a semiconductor substrate.

For example, during dry plasma etching, a semiconductor substrate having an overlying patterned, protective layer, such as a photoresist layer, is positioned on a substrate holder in a plasma processing system. Once the substrate is positioned within the chamber, an ionizable, dissociative gas mixture is introduced, whereby the chemical composition is specially chosen for the specific material being etched on the semiconductor substrate. As the gas is introduced, excess gases are evacuated from the plasma processing system using a vacuum pump.

Thereafter, plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma.

The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

The use of plasma (i.e., electrically charged particles), for example during etching, facilitates the anisotropic removal of material on the substrate in high aspect ratio features. Due to the charge of an ion or electron in the plasma, these particles may be effectively manipulated and guided using an electric field. In some applications where a high degree of anisotropy is required (e.g., polycrystalline silicon etching in front-end-of-line (FEOL) structures), low pressure processing may be required to limit the number of collisions between the directional flow of ions and the background gas. For instance, in an argon plasma, the ion-neutral mean free path is about 3 cm (centimeters) for a pressure of 1 mtorr (millitorr) and it is about 0.15 cm for a pressure of 20 mtorr. Therefore, low pressure processes (e.g., less than about 20 mtorr) may be more suitable for increased directionality for ions incident on the substrate and, hence, etch anisotropy. However, plasma formation and heating are more difficult for such low pressure processes.

SUMMARY OF THE INVENTION

The invention relates to a method for performing plasma processing on a substrate and, more particularly, to a method for processing a substrate with a low pressure plasma and a high pressure plasma in the same plasma processing system.

Furthermore, a method for treating a substrate with plasma over a wide pressure range is described. The method comprises exposing the substrate to a low pressure plasma in a process chamber. Further, the method comprises exposing the substrate to a high pressure plasma in the process chamber.

According to one embodiment, a method for treating a substrate with plasma over a wide pressure range is described. The method comprises disposing the substrate in a process chamber of a plasma processing system configured to treat the substrate with plasma, exposing the substrate to a low pressure plasma in the process chamber, and exposing the substrate to a high pressure plasma in the plasma processing system. The exposure of the substrate to the low pressure plasma comprises: creating a first plasma in a first plasma region of the plasma processing system at a pressure greater than about 10 mtorr; setting a pressure in a second plasma region of the process chamber less than about 10 mtorr; transporting electrons from the first plasma in the first plasma region to the second plasma region; heating the electrons in the second plasma region to form the low pressure plasma; and exposing the substrate to the low pressure plasma in the second plasma region. The exposure of the substrate to the high pressure plasma comprises: setting a pressure in the second plasma region of the process chamber greater than about 10 mtorr; forming the high pressure plasma in the second plasma region; and exposing the substrate to the high pressure plasma in the second plasma region.

DETAILED DESCRIPTION OF EXEMPLARY EMBODIMENTS

In the following description, to facilitate a thorough understanding of the invention and for purposes of explanation and not limitation, specific details are set forth, such as a particular geometry of the plasma processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1:
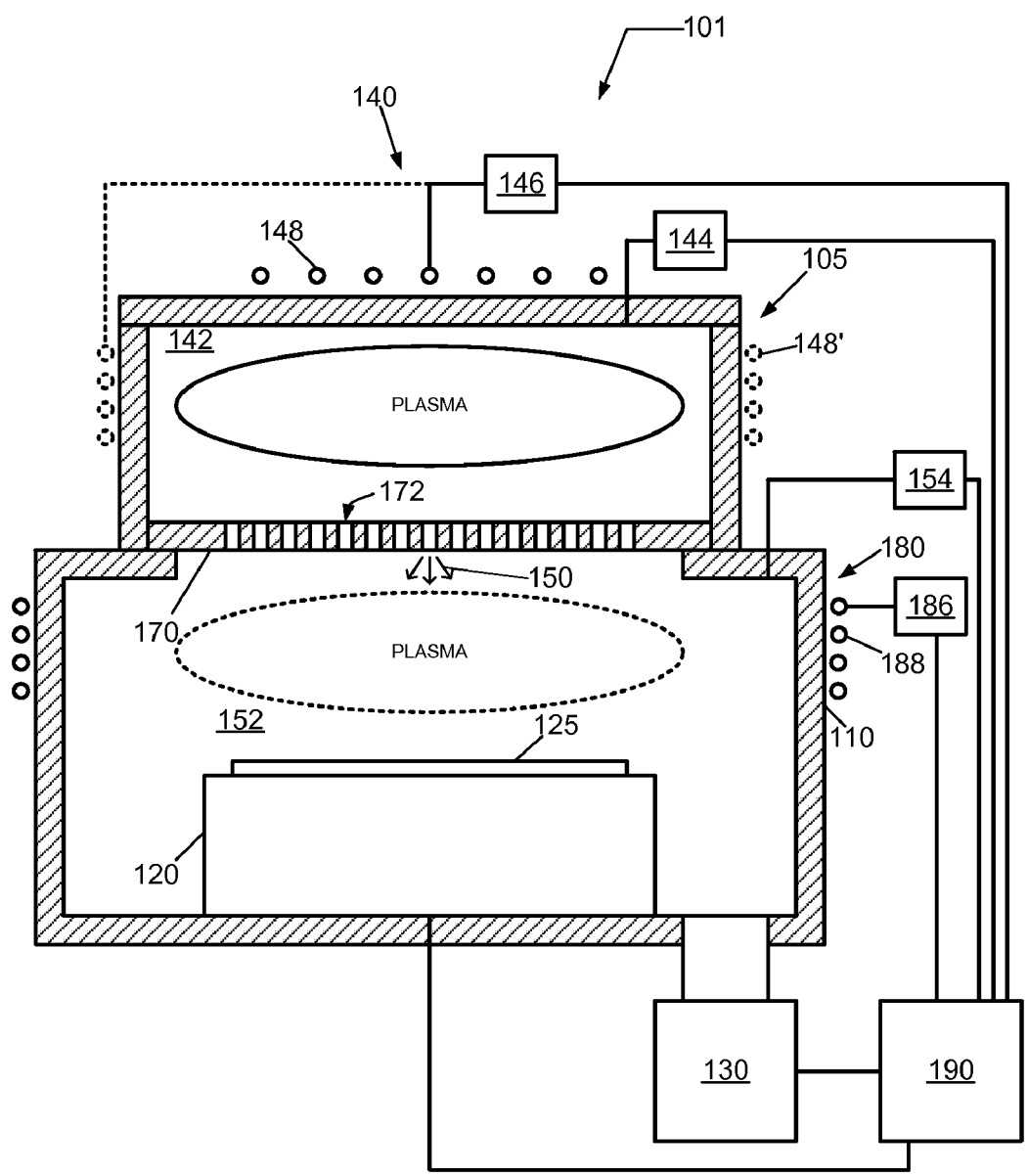
FIG. 1 shows a plasma processing system according to an embodiment.

Referring now to the drawings, wherein like reference numerals designate identical or corresponding parts throughout the several views, FIG. 1 depicts a plasma processing system 101 comprising a plasma generation chamber 105 configured to produce a first plasma, and a process chamber 110 configured to provide a contaminant-free, vacuum environment for plasma processing of a substrate 125. The process chamber 110 comprises a substrate holder 120 configured to support substrate 125, and a vacuum pumping system 130 coupled to the process chamber 110 and configured to evacuate the process chamber 110.

The plasma generation chamber 105 comprises a first plasma region 142 configured to receive a first process gas at a first pressure and form the first plasma. Furthermore, the process chamber 110 comprises a second plasma region 152 disposed downstream of the first plasma region 142 and configured to receive electrons 150 and the first process gas from the first plasma region 142 and form a second plasma therein at a second pressure.

A first gas injection system 144 is coupled to the plasma generation chamber 105, and configured to introduce the first process gas to the first plasma region 142. The first process gas may comprise an electropositive gas or an electronegative gas or a mixture thereof. For example, the first process gas may comprise a noble gas, such as Ar. Additionally, for example, the first process gas may comprise any gas suitable for treating substrate 125. Furthermore, for example, the first process gas may comprise any gas having chemical constituents, atomic or molecular, suitable for treating substrate 125. The first gas injection system 144 may include one or more gas supplies or gas sources, one or more control valves, one or more filters, one or more mass flow controllers, etc.

An optional second gas injection system 154 may be coupled to the process chamber 110, and configured to introduce a second process gas to the second plasma region 152. The second process gas may comprise any gas suitable for treating substrate 125. Additionally, for example, the second process gas may comprise any gas having chemical constituents, atomic or molecular, suitable for treating substrate 125. The second gas injection system may include one or more gas supplies or gas sources, one or more control valves, one or more filters, one or more mass flow controllers, etc.

Referring still to FIG. 1, the plasma processing system 101 comprises a plasma generation system 140 coupled to the plasma generation chamber 105 and configured to generate the first plasma in the first plasma region 142. The plasma processing system 101 further comprises a plasma heating system 180 coupled to the process chamber 110 and configured to heat electrons 150 from the first plasma region 142 to form the second plasma in the second plasma region 152.

The plasma generation system 140 can comprise a system configured to produce a capacitively coupled plasma (CCP), an inductively coupled plasma (ICP), a transformer coupled plasma (TCP), a surface wave plasma, a helicon wave plasma, or an electron cyclotron resonant (ECR) heated plasma, or other type of plasma understood by one skilled in the art of plasma formation.

For example, the plasma generation system 140 may comprise a first inductive coil 148 which is coupled to a first power source 146. The first power source 146 may comprise a radio frequency (RF) generator that couples RF power through an optional impedance match network to first inductive coil 148. RF power is inductively coupled from first inductive coil 148 through a dielectric window (not shown) to plasma in the first plasma region 142. A typical frequency for the application of RF power to the inductive coil can range from about 10 MHz to about 100 MHz. In addition, a slotted Faraday shield (not shown) can be employed to reduce capacitive coupling between the first inductive coil 148 and plasma.

An impedance match network may serve to improve the transfer of RF power to plasma by reducing the reflected power. Match network topologies (e.g. L-type, π-type, T-type, etc.) and automatic control methods are well known to those skilled in the art.

As illustrated in FIG. 1, the first inductive coil 148 may be a planar coil, such as a "spiral" coil or "pancake" coil, in communication with the plasma from above as in a transformer coupled plasma (TCP). Alternatively, as illustrated in FIG. 1, the first inductive coil may include a cylindrical coil, such as helical coil 148'. The design and implementation of an ICP source, or TCP source, is well known to those skilled in the art.

As an example, in an electropositive discharge, the electron density may range from approximately $10^{10}$ cm$^{-3}$ to $10^{13}$ cm$^{-3}$, and the electron temperature may range from about 1 eV to about 10 eV (depending on the type of plasma source utilized).

The plasma heating system 180 is configured to heat electrons 150 from the first plasma region 142 in the second plasma region 152 by utilizing capacitively coupled plasma (CCP) technology, inductively coupled plasma (ICP) technology, transformer coupled plasma (TCP) technology, surface wave plasma technology, helicon wave plasma technology, or electron cyclotron resonant (ECR) heated plasma technology, or other type of plasma technology understood by one skilled in the art of plasma formation.

For example, the plasma heating system 180 may comprise a second inductive coil 188 which is coupled to a second power source 186. The second power source 186 may comprise a RF generator that couples RF power through an optional impedance match network to second inductive coil 188. RF power is inductively coupled from second inductive coil 188 through a dielectric window (not shown) to plasma in the second plasma region 152. A typical frequency for the application of RF power to the inductive coil can range from about 10 MHz to about 100 MHz. In addition, a slotted Faraday shield (not shown) can be employed to reduce capacitive coupling between the second inductive coil 188 and plasma.

An impedance match network may serve to improve the transfer of RF power to plasma by reducing the reflected power. Match network topologies (e.g. L-type, π-type, T-type, etc.) and automatic control methods are well known to those skilled in the art.

Referring still to FIG. 1, a separation member 170 is disposed between the first plasma region 142 and the second plasma region 152, wherein the separation member 170 comprises one or more openings 172 configured to allow passage of the first process gas as well as transport of electrons 150 from the first plasma in the first plasma region 142 to the second plasma region 152 in order to form the second plasma in the second plasma region 152. The one or more openings 172 in the separation member 170 may comprise super-Debye length apertures, i.e., the transverse dimension or diameter is larger than the Debye length. The one or more openings 172 may be sufficiently large to permit adequate electron transport, and the one or more openings 172 may be sufficiently small to prevent or reduce electron heating across the separation member 170. The one or more openings 172 may be sufficiently small to sustain a pressure difference between the first pressure in the first plasma region 142 and the second pressure in the second plasma region 152.

As illustrated in FIG. 1, electrons 150 are transported from the first plasma region 142 to the second plasma region 152 through separation member 170. The electron transport may be driven by diffusion, or it may be driven by field-enhanced diffusion. As electrons 150 emerge from the separation member 170 and enter the second plasma region 152, they are heated by plasma heating system 180.

In this configuration, where electrons 150 are fed from the first plasma region 142 to the second plasma region 152 and heated in the second plasma region 152, the second pressure may be low relative to the first pressure in the first plasma region 142. For example, the first pressure may be approximately an order of magnitude larger (e.g., 5 times greater (5×), 10×, 20×, 30×, etc.) than the second pressure. Additionally, for example, the first pressure may be selected for ease of plasma ignition and for efficient generation of plasma, while the second pressure is selected to be relatively low in order to reduce or minimize collisions in the second plasma region 152.

Furthermore, for example, the first pressure may be greater than about 10 mtorr (millitorr), while the second pressure is less than about 10 mtorr. Alternatively, for example, the first pressure may be greater than about 20 mtorr, while the second pressure is less than about 10 mtorr. Alternatively, for example, the first pressure may be greater than about 50 mtorr, while the second pressure is less than about 10 mtorr. Alternatively, for example, the first pressure may be greater than about 10 mtorr, while the second pressure is less than about 5 mtorr. Alternatively, for example, the first pressure may be greater than about 10 mtorr, while the second pressure is less than about 1 mtorr. Alternatively yet, for example, the first pressure may be greater than about 50 mtorr, while the second pressure is less than about 5 mtorr.

Further yet, for example, the first pressure may range from about 10 mtorr to about 500 mtorr, e.g., about 20 mtorr to about 100 mtorr (e.g., 30 mtorr), while the second pressure may range from about 0.1 mtorr to about 10 mtorr, e.g., about 1 mtorr to about 10 mtorr (e.g., 3 mtorr).

Figure 2:
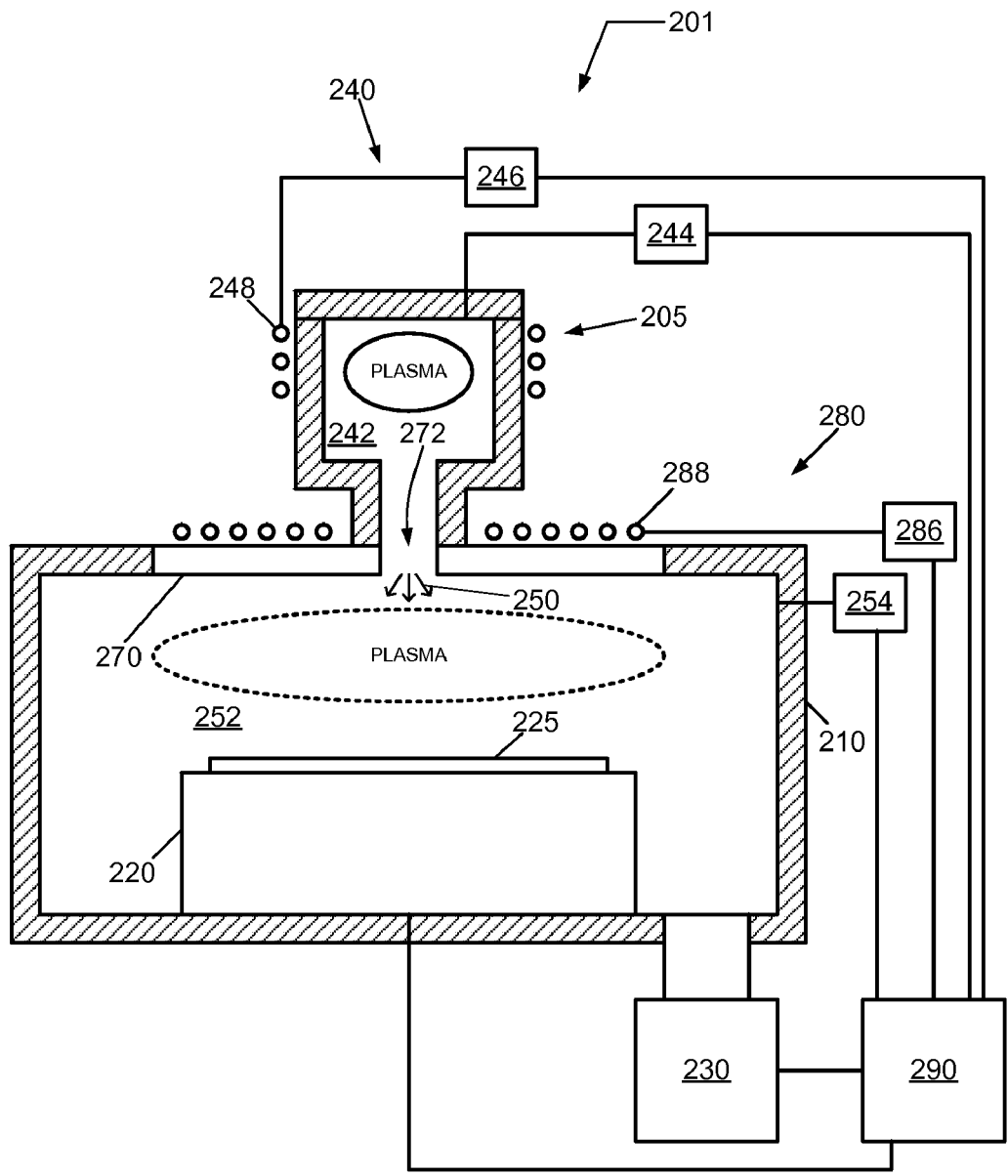
FIG. 2 shows a plasma processing system according to another embodiment.

Referring now to FIG. 2 wherein like reference numerals designate identical or corresponding parts throughout the several views, a plasma processing system 201 is provided comprising a plasma generation chamber 205 configured to produce a first plasma, and a process chamber 210 configured to provide a contaminant-free, vacuum environment for plasma processing of a substrate 225. The process chamber 210 comprises a substrate holder 220 configured to support substrate 225, and a vacuum pumping system 230 coupled to the process chamber 210 and configured to evacuate the process chamber 210.

The plasma generation chamber 205 comprises a first plasma region 242 configured to receive a first process gas at a first pressure and form the first plasma. Furthermore, the process chamber 210 comprises a second plasma region 252 disposed downstream of the first plasma region 242 and configured to receive the first process gas as well as electrons 250 from the first plasma region 242 and form a second plasma therein at a second pressure.

A first gas injection system 244 is coupled to the plasma generation chamber 205, and configured to introduce the first process gas to the first plasma region 242. The first process gas may comprise an electropositive gas or an electronegative gas or a mixture thereof. For example, the first process gas may comprise a noble gas, such as Ar. Additionally, for example, the first process gas may comprise any gas suitable for treating substrate 225. Furthermore, for example, the first process gas may comprise any gas having chemical constituents, atomic or molecular, suitable for treating substrate 225. The first gas injection system 244 may include one or more gas supplies or gas sources, one or more control valves, one or more filters, one or more mass flow controllers, etc.

An optional second gas injection system 254 may be coupled to the process chamber 210, and configured to introduce a second process gas to the second plasma region 252. The second process gas may comprise any gas suitable for treating substrate 225. Additionally, for example, the second process gas may comprise any gas having chemical constituents, atomic or molecular, suitable for treating substrate 225. The second gas injection system may include one or more gas supplies or gas sources, one or more control valves, one or more filters, one or more mass flow controllers, etc.

Referring still to FIG. 2, the plasma processing system 201 comprises a plasma generation system 240 coupled to the plasma generation chamber 205 and configured to generate the first plasma in the first plasma region 242. The plasma processing system 201 further comprises a plasma heating system 280 coupled to the process chamber 210 and configured to heat electrons 250 from the first plasma region 242 to form the second plasma in the second plasma region 252.

The plasma generation system 240 can comprise a system configured to produce a capacitively coupled plasma (CCP), an inductively coupled plasma (ICP), a transformer coupled plasma (TCP), a surface wave plasma, a helicon wave plasma, or an electron cyclotron resonant (ECR) heated plasma, or other type of plasma understood by one skilled in the art of plasma formation.

For example, the plasma generation system 240 may comprise a first inductive coil 248 which is coupled to a first power source 246. The first power source 246 may comprise a radio frequency (RF) generator that couples RF power through an optional impedance match network to first inductive coil 248. RF power is inductively coupled from first inductive coil 248 through a dielectric window (not shown) to plasma in the first plasma region 242. A typical frequency for the application of RF power to the inductive coil can range from about 10 MHz to about 100 MHz. In addition, a slotted Faraday shield (not shown) can be employed to reduce capacitive coupling between the first inductive coil 248 and plasma.

An impedance match network may serve to improve the transfer of RF power to plasma by reducing the reflected power. Match network topologies (e.g. L-type, π-type, T-type, etc.) and automatic control methods are well known to those skilled in the art.

As illustrated in FIG. 2, the first inductive coil 248 may be a cylindrical coil, such as helical coil. Alternatively, the first inductive coil may be a planar coil, such as "spiral" coil or "pancake" coil, in communication with the plasma from above as in a transformer coupled plasma (TCP). The design and implementation of an ICP source, or TCP source, is well known to those skilled in the art.

As an example, in an electropositive discharge, the electron density may range from approximately $10^{10}$ cm$^{-3}$ to $10^{13}$ cm$^{-3}$, and the electron temperature may range from about 1 eV to about 10 eV (depending on the type of plasma source utilized).

The plasma heating system 280 is configured to heat electrons 250 from the first plasma region 242 in the second plasma region 252 by utilizing a transformer coupled plasma (TCP) source. The TCP source may comprise a second inductive coil 288 which is coupled to a second power source 286. The second power source 286 may comprise a RF generator that couples RF power through an optional impedance match network to second inductive coil 288. RF power is inductively coupled from second inductive coil 288 through a dielectric window 270, formed in the ceiling of the process chamber 210, to plasma in the second plasma region 252. A typical frequency for the application of RF power to the inductive coil can range from about 10 MHz to about 100 MHz. In addition, a slotted Faraday shield (not shown) can be employed to reduce capacitive coupling between the second inductive coil 288 and plasma.

An impedance match network may serve to improve the transfer of RF power to plasma by reducing the reflected power. Match network topologies (e.g. L-type, π-type, T-type, etc.) and automatic control methods are well known to those skilled in the art.

Referring still to FIG. 2, at least one opening 272 is formed through the dielectric window 270 in the ceiling of process chamber 210 that is disposed between the first plasma region 242 and the second plasma region 252, wherein the at least one opening 272 in the ceiling of process chamber 210 is configured to allow passage of the first process gas as well as transport of electrons 250 from the first plasma in the first plasma region 242 to the second plasma region 252 in order to form the second plasma in the second plasma region 252. The at least one opening 272 may comprise a super-Debye length aperture, i.e., the transverse dimension or diameter is larger than the Debye length. The at least one opening 272 may be sufficiently large to permit adequate electron transport. The at least one opening 272 may be sufficiently small to sustain a pressure difference between the first pressure in the first plasma region 242 and the second pressure in the second plasma region 252.

As illustrated in FIG. 2, electrons 250 are transported from the first plasma region 242 to the second plasma region 252 through at least one opening 272. The electron transport may be driven by diffusion, or it may be driven by field-enhanced diffusion. As electrons 250 emerge from the at least one opening 272 and enter the second plasma region 252, they are heated by plasma heating system 280.

In this configuration, where electrons 250 are fed from the first plasma region 242 to the second plasma region 252 and heated in the second plasma region 252, the second pressure may be low relative to the first pressure in the first plasma region 242. For example, the first pressure may be approximately an order of magnitude larger (e.g., 5 times greater (5×), 10×, 20×, 30×, etc.) than the second pressure. Additionally, for example, the first pressure may be selected for ease of plasma ignition and for efficient generation of plasma, while the second pressure is selected to be relatively low in order to reduce or minimize collisions in the second plasma region 252.

Furthermore, for example, the first pressure may be greater than about 10 mtorr (millitorr), while the second pressure is less than about 10 mtorr. Alternatively, for example, the first pressure may be greater than about 20 mtorr, while the second pressure is less than about 10 mtorr. Alternatively, for example, the first pressure may be greater than about 50 mtorr, while the second pressure is less than about 10 mtorr. Alternatively, for example, the first pressure may be greater than about 10 mtorr, while the second pressure is less than about 5 mtorr. Alternatively, for example, the first pressure may be greater than about 10 mtorr, while the second pressure is less than about 1 mtorr. Alternatively yet, for example, the first pressure may be greater than about 50 mtorr, while the second pressure is less than about 5 mtorr.

Further yet, for example, the first pressure may range from about 10 mtorr to about 500 mtorr, e.g., about 20 mtorr to about 100 mtorr (e.g., 30 mtorr), while the second pressure may range from about 0.1 mtorr to about 10 mtorr, e.g., about 1 mtorr to about 10 mtorr (e.g., 3 mtorr).

Vacuum pumping system 130 (or 230) may, for example, include a turbo-molecular vacuum pump (TMP) capable of a pumping speed up to 5000 liters per second (and greater) and a vacuum valve (or second vacuum valve), such as a gate valve, for throttling the pressure in the second plasma region 152 or 252. Furthermore, a device for monitoring chamber pressure (not shown) can be coupled to the process chamber 110 (or 210). The pressure measuring device may be, for example, a Type 628B Baratron absolute capacitance manometer commercially available from MKS Instruments, Inc. (Andover, Mass.).

Referring to FIGS. 1 and 2, plasma processing system 101 (or 201) may comprise a substrate bias system coupled to substrate holder 120 (or 220) and configured to electrically bias substrate 125 (or 225). For example, the substrate holder 120 (or 220) may include an electrode that is coupled to a RF generator through an optional impedance match network. A typical frequency for the application of power to the substrate holder 120 (or 220) may range from about 0.1 MHz to about 100 MHz.

Referring still to FIGS. 1 and 2, plasma processing system 101 (or 201) may comprise a substrate temperature control system coupled to the substrate holder 120 (or 220) and configured to adjust and control the temperature of substrate 125 (or 225). The substrate temperature control system comprises temperature control elements, such as a cooling system including a re-circulating coolant flow that receives heat from substrate holder 120 (or 220) and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 120 (or 220), as well as the chamber wall of the process chamber 110 (or 210) and any other component within the plasma processing system 101 (or 201).

In order to improve the thermal transfer between substrate 125 (or 225) and substrate holder 120 (or 220), substrate holder 120 (or 220) can include a mechanical clamping system, or an electrical clamping system, such as an electrostatic clamping system, to affix substrate 125 (or 225) to an upper surface of substrate holder 120 (or 220). Furthermore, substrate holder 120 (or 220) can further include a substrate backside gas delivery system configured to introduce gas to the back-side of substrate 125 (or 225) in order to improve the gas-gap thermal conductance between substrate 125 (or 225) and substrate holder 120 (or 220). Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 225.

Referring still to FIGS. 1 and 2, plasma processing system 101 (or 201) can further comprise a controller 190 (or 290). Controller 190 (or 290) comprises a microprocessor, memory, and a digital I/O port capable of generating control signals sufficient to communicate and activate inputs to plasma processing system 101 (or 201) as well as monitor outputs from plasma processing system 101 (or 201). Moreover, controller 190 (or 290) can be coupled to and can exchange information with plasma generation system 140 (or 240) including first gas injection system 144 (or 244) and first power source 146 (or 246), plasma heating system 180 (or 280) including optional second gas injection system 154 (or 254) and second power source 186 (or 286), substrate holder 120 (or 220), and vacuum pumping system 130 (or 230). For example, a program stored in the memory can be utilized to activate the inputs to the aforementioned components of processing system 101 (or 201) according to a process recipe in order to perform the method of treating substrate 125 (or 225).

However, the controller 190 (or 290) may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 190 (or 290) includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 190 (or 290), for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 190 (or 290) for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 190 (or 290).

Controller 190 (or 290) may be locally located relative to the processing system 101 (or 201), or it may be remotely located relative to the processing system 101 (or 201) via an internet or intranet. Thus, controller 190 (or 290) can exchange data with the processing system 101 (or 201) using at least one of a direct connection, an intranet, or the internet. Controller 190 (or 290) may be coupled to an intranet at a customer site (i.e., a device maker, etc.), or coupled to an intranet at a vendor site (i.e., an equipment manufacturer). Furthermore, another computer (i.e., controller, server, etc.) can access controller 190 (or 290) to exchange data via at least one of a direct connection, an intranet, or the internet.

Figure 3:
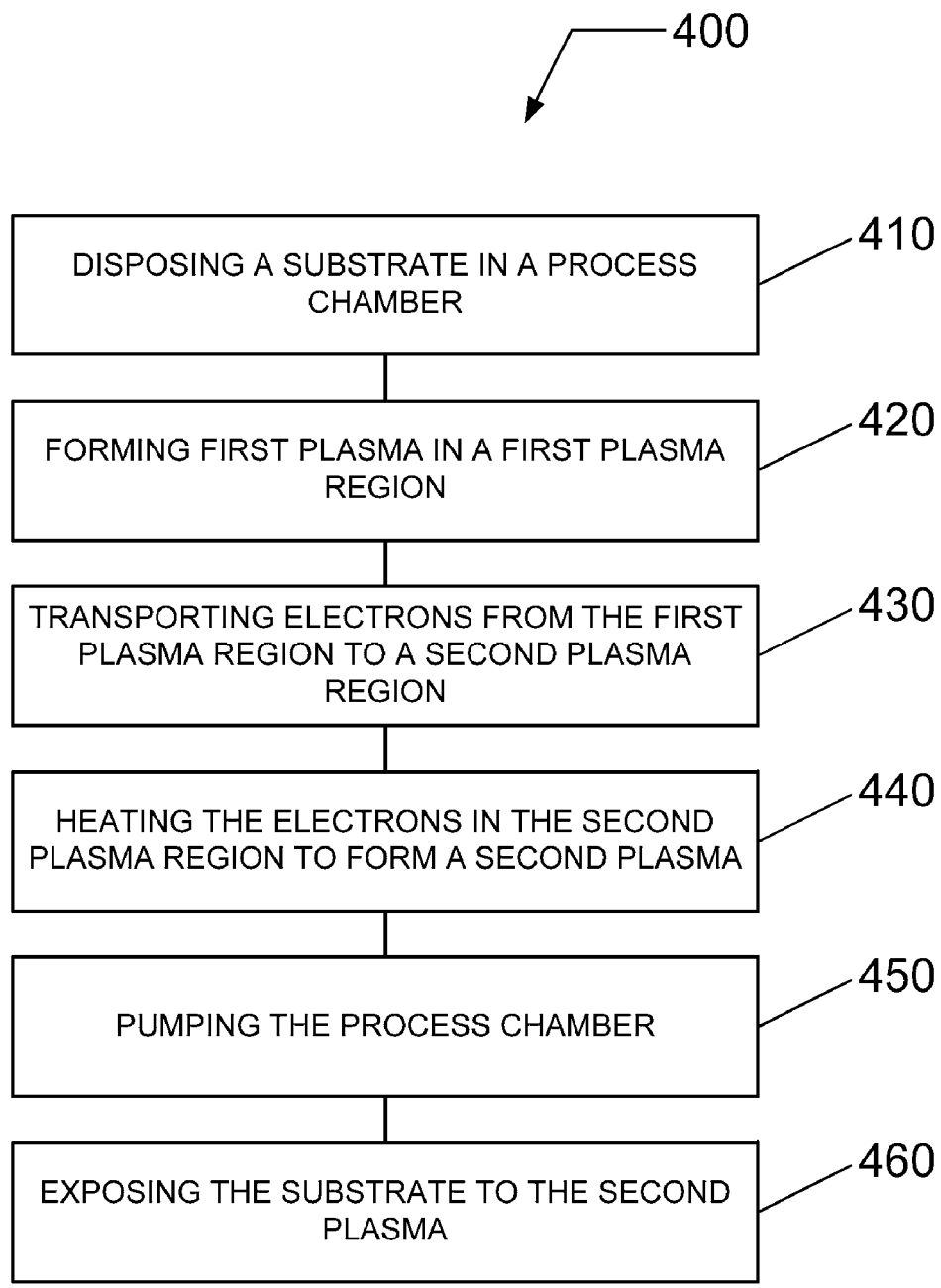
FIG. 3 illustrates a method of operating a plasma processing system configured to treat a substrate according to an embodiment.

Referring now to FIG. 3, a flow chart 400 is provided of a method for operating a plasma processing system to treat a substrate according to an embodiment of the invention. Flow chart 400 begins in 410 with disposing a substrate in a plasma processing chamber configured to facilitate the treatment of the substrate using plasma. The plasma processing chamber may include components of any one of the plasma processing systems described in FIGS. 1 and 2.

In 420, a first plasma is formed from a first process gas in a first plasma region. As illustrated in FIGS. 1 and 2, the first plasma region may be located in a plasma generation chamber, and a plasma generation system may be coupled to the plasma generation chamber in order to form the first plasma.

In 430, electrons from the first plasma in the first plasma region are transported or supplied to a second region disposed downstream of the first plasma region. As illustrated in FIGS. 1 and 2, the second plasma region may be located in a process chamber, wherein one or more openings or passages disposed between the plasma generation chamber and the process chamber facilitate the transport or supply of electrons from the first plasma region to the second plasma region.

In 440, electrons that are supplied from the first plasma region to the second plasma region are heated by a plasma heating system. The electrons may be heated in the presence of the first process gas and an optional second process gas that may be introduced to the process chamber.

In 450, gases entering the process chamber are pumped by a vacuum pumping system. In 460, the substrate is exposed to the second plasma in the second plasma region.

Figure 4:
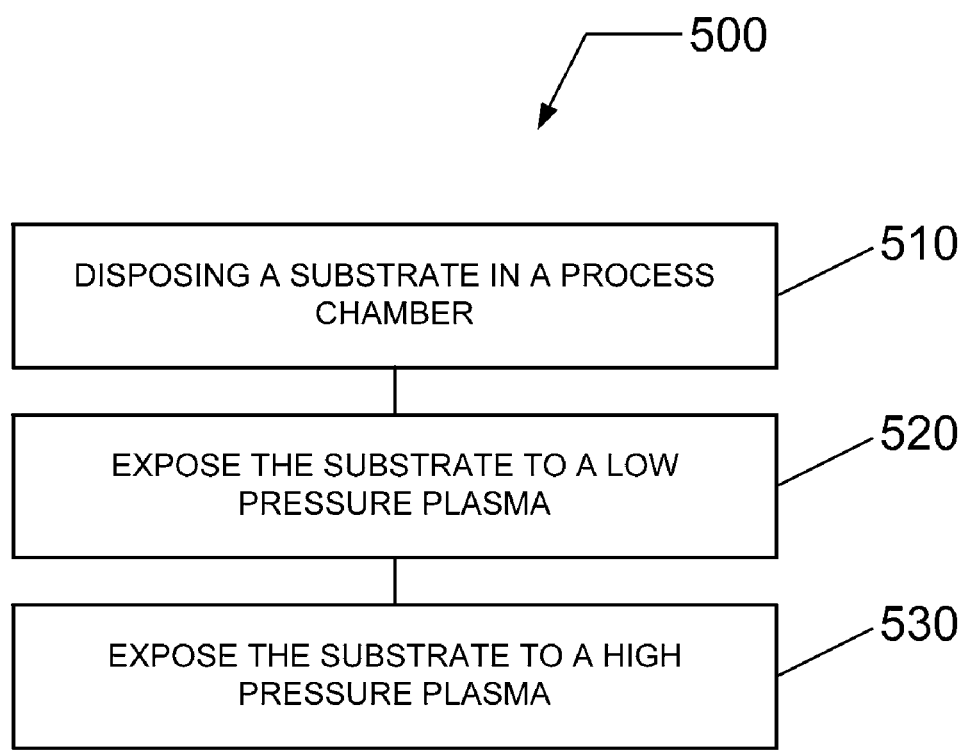
FIG. 4 illustrates a method of operating a plasma processing system configured to treat a substrate according to another embodiment.

Referring now to FIG. 4, a flow chart 500 is provided of a method for treating a substrate with plasma over a wide pressure range according to another embodiment. Flow chart 500 begins in 510 with disposing the substrate in a process chamber of a plasma processing system configured to treat the substrate with plasma. The plasma processing system may include the plasma processing system described in FIG. 1 or 2, or any combination thereof.

The plasma processing system of FIG. 1 and FIG. 2 provides components that permit the formation of a high pressure plasma adjacent an upper surface of the substrate. Furthermore, the plasma processing system of FIG. 1 and FIG. 2 also provides components that permit the formation of a low pressure plasma adjacent the upper surface of the substrate. For example, when forming a low pressure plasma adjacent the upper surface of the substrate, a high pressure plasma (formed at a pressure greater than or equal to 10 mtorr) may be formed remotely from the upper surface of the substrate and may be utilized to assist the formation of the low pressure plasma adjacent the upper surface of the substrate.

In 520, the substrate is exposed to a low pressure plasma in the process chamber. The exposure of the substrate to the low pressure plasma comprises: creating a first plasma in a first plasma region of the plasma processing system at a pressure greater than about 10 mtorr; setting a pressure in a second plasma region of the process chamber less than about 10 mtorr; transporting electrons from the first plasma in the first plasma region to the second plasma region; heating the electrons in the second plasma region to form the low pressure plasma; and exposing the substrate to the low pressure plasma in the second plasma region. During low pressure plasma processing, the pressure in the second region may less than or equal to about 5 mtorr. Alternatively, during low pressure plasma processing, the pressure in the second region may less than or equal to about 1 mtorr.

Furthermore, during low pressure plasma processing, power from a first power source is coupled to the first plasma in the first plasma region during the creating of the first plasma, and power is coupled from a second power source to the low pressure plasma in the second plasma region during the heating of the low pressure plasma.

In 530, the substrate is exposed to a high pressure plasma in the plasma processing system. The exposure of the substrate to the high pressure plasma comprises: setting a pressure in the second plasma region of the process chamber greater than about 10 mtorr; forming the high pressure plasma in the second plasma region; and exposing the substrate to the high pressure plasma in the second plasma region. During high pressure plasma processing, the pressure in the second region may greater than or equal to about 20 mtorr. Alternatively, during high pressure plasma processing, the pressure in the second region may greater than or equal to about 50 mtorr.

Furthermore, during high pressure plasma processing, power is coupled from the second power source to the high pressure plasma in the second plasma region during the forming of the high pressure plasma. Power from the first power source may not be coupled to the first plasma region, or power may be coupled to the first plasma region.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for treating a substrate with plasma over a wide pressure range, comprising:
    disposing said substrate in a process chamber of a plasma processing system configured to treat said substrate with plasma;
    exposing said substrate to a low pressure plasma in said process chamber, wherein said exposing said substrate to said low pressure plasma comprises:
        creating a first plasma using a first electromagnetic field in a first plasma region of said plasma processing system at a pressure greater than about 10 mtorr;
        setting a pressure in a second plasma region of said process chamber less than about 10 mtorr;
        transporting electrons from said first plasma in said first plasma region to said second plasma region;
        heating said electrons using a second electromagnetic field in said second plasma region to form said low pressure plasma; and
        exposing said substrate to said low pressure plasma in said second plasma region; and
    exposing said substrate to a high pressure plasma in said plasma processing system, wherein said exposing said substrate to said high pressure plasma comprises:
        setting a pressure in said second plasma region of said process chamber greater than about 10 mtorr;
        forming said high pressure plasma in said second plasma region; and
        exposing said substrate to said high pressure plasma in said second plasma region.

2. The method of claim 1, wherein said first plasma region is located in a plasma generation chamber and said second plasma region is located in said process chamber, and wherein said plasma generation chamber is coupled to said process chamber.

3. The method of claim 2, wherein said exposing said substrate to said low pressure plasma further comprises:
    introducing a first process gas to said first plasma region using a first gas injection system, said first gas injection system coupled to said plasma generation chamber; and
    introducing a second process gas to said second plasma region using a second gas injection system, said second gas injection system coupled to said process chamber.

4. The method of claim 3, wherein said exposing said substrate to said low pressure plasma further comprises:
    coupling power from a first power source to said first plasma via said first electromagnetic field in said first plasma region during said creating; and
    coupling power from a second power source to said low pressure plasma via said second electromagnetic field in said second plasma region during said heating.

5. The method of claim 4, wherein said coupling power from said first power source comprises coupling radio frequency (RF) power to an inductive coil configured to inductively couple power from said first power source to said first process gas in said first plasma region.

6. The method of claim 4, wherein said coupling power from said second power source comprises coupling power to an inductive coil configured to inductively couple RF power from said second power source to said second process gas in said second plasma region.

7. The method of claim 3, wherein said first process gas is different from said second process gas.

8. The method of claim 2, wherein said exposing said substrate to said high pressure plasma further comprises:
    introducing a first process gas to said first plasma region using a first gas injection system, said first gas injection system coupled to said plasma generation chamber; or
    introducing a second process gas to said second plasma region using a second gas injection system, said second gas injection system coupled to said process chamber; or both.

9. The method of claim 8, wherein said exposing said substrate to said high pressure plasma further comprises:
    coupling power from said second power source to said high pressure plasma in said second plasma region during said forming, while not coupling power from said first power source to said first plasma region.

10. The method of claim 8, wherein said exposing said substrate to said high pressure plasma further comprises:
    coupling power from a first power source to said first plasma region during said forming; and
    coupling power from a second power source to said high pressure plasma in said second plasma region during said forming.

11. The method of claim 1, wherein said exposing said substrate to said low pressure plasma further comprises:
    separating said first plasma region from said second plasma region using a separation member, wherein said separation member comprises one or more openings configured to allow said transport of electrons from said first plasma region to said second plasma region, and configured to sustain the difference between said pressure in said first plasma region and said pressure in said second plasma region.

12. The method of claim 11, wherein one or more of said one or more openings in said separation member comprises a diameter greater than or equal to a Debye length.

13. The method of claim 1, wherein said separation member is configured to sustain a pressure ratio between the pressure in said first region and the pressure in said second region greater than or equal to a value of about 5.

14. The method of claim 1, wherein said separation member is configured to sustain a pressure ratio between the pressure in said first region and the pressure in said second region greater than or equal to a value of about 10.

15. The method of claim 1, wherein said disposing said substrate in said process chamber comprises disposing said substrate on a substrate holder coupled to said process chamber and configured to support said substrate proximate said second plasma region.

16. The method of claim 15, further comprising:
electrically biasing said substrate holder by coupling RF power to said substrate holder.

17. The method of claim 1, wherein said exposing said substrate to said high pressure plasma comprises setting a pressure in said second plasma region greater than about 20 mtorr.

18. The method of claim 1, wherein said exposing said substrate to said high pressure plasma comprises setting a pressure in said second plasma region greater than about 50 mtorr.

19. The method of claim 1, wherein said exposing said substrate to said high pressure plasma comprises setting a pressure in said second plasma region less than about 5 mtorr.

20. The method of claim 1, wherein said exposing said substrate to said low pressure plasma comprises setting a pressure in said second plasma region less than about 1 mtorr.

* * * * *